(12) United States Patent
Fearn

(10) Patent No.: US 9,664,745 B1
(45) Date of Patent: May 30, 2017

(54) COMPUTER IMPLEMENTED SYSTEM AND METHOD AND COMPUTER PROGRAM PRODUCT FOR USING BATTERY INFORMATION TO AUTOMATICALLY CHARGE A BATTERY

(71) Applicant: Material Handling Services, LLC, Perrysburg, OH (US)

(72) Inventor: Kenneth E Fearn, Winston-Salem, NC (US)

(73) Assignee: Material Handling Services, LLC, Perrysburg, OH (US)

( * ) Notice: Subject to any disclaimer, the term of this patent is extended or adjusted under 35 U.S.C. 154(b) by 974 days.

(21) Appl. No.: 13/912,923

(22) Filed: Jun. 7, 2013

(51) Int. Cl.
*G01R 31/36* (2006.01)
*H02J 7/00* (2006.01)

(52) U.S. Cl.
CPC .......... *G01R 31/3648* (2013.01); *H02J 7/007* (2013.01)

(58) Field of Classification Search
CPC combination set(s) only.
See application file for complete search history.

(56) References Cited

U.S. PATENT DOCUMENTS

| | | |
|---|---|---|
| 6,441,584 B1 | 8/2002 | Crass |
| 6,549,014 B1 | 4/2003 | Kutkut et al. |
| 7,173,429 B2 | 2/2007 | Kutkut et al. |
| 7,191,077 B2 * | 3/2007 | Mese .................... H01M 10/42 702/63 |
| 8,200,292 B2 | 6/2012 | Wu et al. |
| 8,330,467 B2 | 12/2012 | Jones et al. |
| 8,334,675 B2 | 12/2012 | Wang et al. |
| 8,341,449 B2 | 12/2012 | Daniel et al. |
| 8,482,258 B2 | 7/2013 | Jones et al. |
| 8,525,483 B2 | 9/2013 | Danner |
| 2003/0015993 A1 | 1/2003 | Misra et al. |
| 2005/0038614 A1 | 2/2005 | Botts et al. |
| 2009/0024232 A1* | 1/2009 | Dickinson ................. B60L 3/12 700/89 |
| 2011/0012563 A1 | 1/2011 | Paryani et al. |
| 2012/0139476 A1 | 6/2012 | Evans et al. |
| 2012/0274280 A1* | 11/2012 | Yip ....................... H02J 7/0014 320/112 |

(Continued)

OTHER PUBLICATIONS

Storage Battery Systems, Inc., PowerTrac SP Product technical data sheet, www.sbsbattery.com., date unknown, but believed to be at least as early as Jun. 7, 2013.

*Primary Examiner* — Huan Tran
(74) *Attorney, Agent, or Firm* — Fraser Clemens Martin & Miller LLC; Michael E. Dockins

(57) ABSTRACT

A computer implemented system and method and a computer program product for automatically determining a battery charging profile. Historical battery information about a battery from a battery data recorder associated with the battery and battery charging information about the battery from a battery charger associated with the battery may be used to select one of a plurality of battery charging profiles or to create a battery charging profile. Information about the selected or created battery charging profile may be outputted or transmitted to a battery charger via an application programming interface. Battery application information and battery environment information also may be used to select or create a battery charging profile for charging a battery.

60 Claims, 5 Drawing Sheets

(56) References Cited

U.S. PATENT DOCUMENTS

| | | |
|---|---|---|
| 2013/0004811 A1 | 1/2013 | Banerjee et al. |
| 2013/0038292 A1 | 2/2013 | Barrett et al. |
| 2013/0154652 A1 | 6/2013 | Rice et al. |
| 2013/0214730 A1* | 8/2013 | Lu .......................... H02J 7/007 320/107 |
| 2014/0095091 A1* | 4/2014 | Moore .................... H04Q 9/00 702/63 |

* cited by examiner

COMPUTER IMPLEMENTED SYSTEM AND METHOD AND COMPUTER PROGRAM PRODUCT FOR USING BATTERY INFORMATION TO AUTOMATICALLY CHARGE A BATTERY

FIELD OF THE INVENTION

The invention is related to a computer implemented system, method, and a computer program product for managing information about a battery, battery charger, battery environment or battery application, which may be used to charge a battery according to an automatically selected and/or generated battery charging profile.

BACKGROUND AND SUMMARY

A distribution or manufacturing facility may use material handling equipment, including a wide range of electric powered vehicles, such as electric forklifts and automated guided vehicle systems. A large facility may operate hundreds of such electric powered vehicles, which, in turn, require a large number of industrial batteries to provide power to such electric vehicles. As may be appreciated, it is desirable to maximize the performance and useful life of such a large number of industrial batteries thereby lowering the overall cost of ownership of such assets.

Known systems and methods for managing resources, such as industrial batteries, monitors information received about batteries and battery chargers, analyzes the information to identify battery performance and charging issues and problems, and communicates information to personnel to take action to address the identified issues and problems. Such known systems, however, have disadvantages. The present disclosure is directed to a system and method for managing large numbers of industrial batteries that overcome some of the disadvantages of the known systems and methods of doing so.

More specifically, the computer implemented system and method, and the computer program product, of the current disclosure integrates battery and battery charger information from various manufacturers, as well as battery environment and application information, into a common format, and uses business rules to identify battery performance issues and to adjust a battery charging profile by communicating battery profile information to a battery charger via an application programming interface to the battery charger or to communicate a maintenance or repair action to address an identified performance issue. The system and method of the present disclosure also may assess the effectiveness of a battery charging profile adjustment and/or maintenance and/or repair action and generate management reports and other information about battery performance.

DETAILED DESCRIPTION

The following detailed description is provided as an enabling teaching of the invention. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances. Thus, the following description is provided as illustrative of the principles of the invention and not in limitation thereof, since the scope of the invention is defined by the claims.

Reference will now be made in detail to the presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention cover such modifications and variations as come within the scope of the appended claims and their equivalents.

Figure 1:
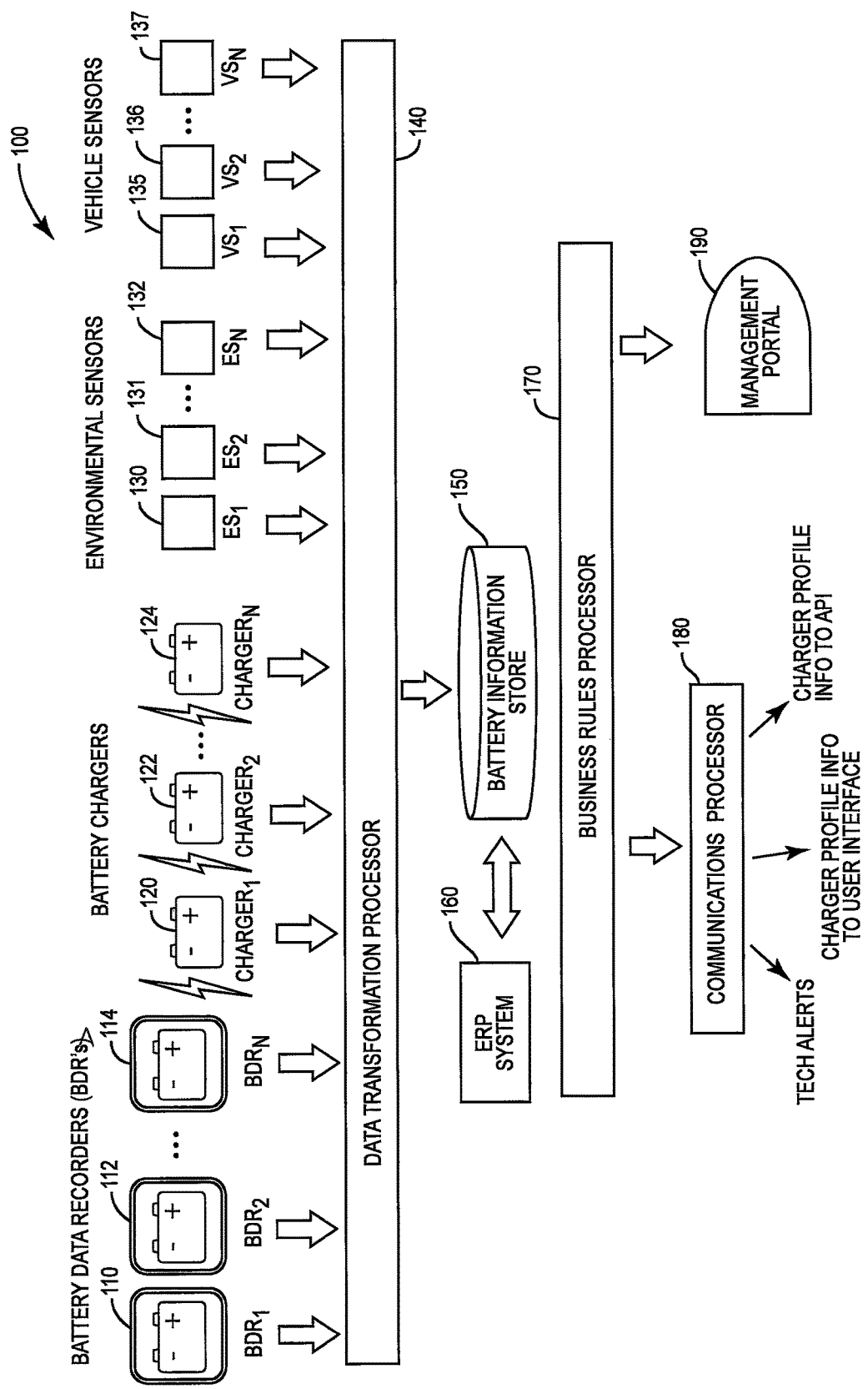
FIG. 1 is a system diagram of a system for using battery information to automatically select and/or create a battery charging profile for a battery, according to some exemplary embodiments.

FIG. 1 illustrates a system for using battery information to automatically select and/or create a battery charging profile for one or more batteries in accordance with some example embodiments of the present disclosure. According to example embodiments of this invention, the batteries may include industrial batteries that provide power to electric vehicles, such as, forklifts, automated guided vehicle (AGV) systems, laser guided vehicle (LGV) systems, airline ground support equipment, personnel carriers, underground mining equipment, floor scrubbers and sweepers, etc. Battery information may be comprised of historical battery information, battery charging information, battery environment information and/or battery application information, each of which will be discussed in more detail below.

As shown in FIG. 1, system 100 may receive information from one or more battery data recorders ("BDR's"), which are designated as $BDR_1$ 110, $BDR_2$ 112 to $BDR_N$ 114. Battery data recorders are generally known in the art and are capable of capturing, storing and/or transmitting information about a battery. Commercially available battery data recorders include those presently available under the trade names eGo®, which are available from Philadelphia Scientific of Montgomeryville, Pa.; PowerTrac™, which are available from Power Designers USA of Madison, Wis.; and Battery Boss®, which are available from Hawker Powersource of Ooltewah, Tenn. The system 100 of the present disclosure is not limited to using these battery data recorders, and other battery data recorders may be used.

Information captured, stored and/or transmitted by a battery data recorder may be referred to in this disclosure as historical battery information. Historical battery information may include, for example, information about a battery's electrolyte levels, voltage during battery discharging, voltage at the beginning of a charging cycle, voltage during a battery charging cycle, voltage at the end of a charging cycle, battery temperature during battery discharging, battery temperature at the beginning of a charging cycle, battery temperature during a battery charging cycle, battery temperature at the end of a charging cycle, battery discharge time, battery idle time, battery charge time, battery ampere hours consumed, battery ampere hours returned, and the frequency and schedule of equalization charges.

Battery data recorders may have an internal computer readable memory for persistently storing captured historical battery information or may transmit the captured historical battery information to computer readable memory devices external to the battery data recorder for persistent storage. A battery data recorder may be integral to a battery or it may be connected to or in communication with a battery and may capture, store and/or transmit historical battery information during use or non-use of a battery or during the charging of a battery. Historical battery information is preferably received by system 100 via an application programming interface but also may be received via a user interface.

As also shown in FIG. 1, system 100 may receive information from one or more battery chargers ("BC's"), which are designated as $BC_1$ 120, $BC_2$ 122 to $BC_N$ 124. Battery chargers are also generally known in the art and are used to charge or recharge a battery. Commercially available battery chargers include those presently available under the trade names LIFEPLUS® and LIFESPEED® which are available from Hawker Powersource of Ooltewah, Tenn.; Z Series, which are available from Zapi, Inc. of Raleigh, N.C.; and PCiHF & PCXP Series, which are available from PowerDesigners USA of Madison, Wis. The system 100 of the present disclosure is not limited to using these battery chargers and other battery chargers may be used. As may be appreciated, battery chargers may capture, store and/or transmit information about the charging of a battery, which may be referred to in this disclosure as battery charging information.

Examples of such battery charging information may include information about a battery charger's technical specifications. A battery charger's technical specifications may include information about the capability to adjust charger parameters, including, for example, current, voltage and time duration within a varying number and sequence of charge phases, as well as the upper and lower limits of current and voltage for each charge phase. Such information may be used to create a battery charging profile, which is discussed in more detail below.

Battery charging information also may include information about the battery charging profiles that can be executed by a battery charger. Battery charging profile information is discussed in more detail below.

Battery charging information also may include information about the number of charging cycles performed by the charger, a log of interruption events, a log of information about complete and partial charge cycles, which may include information about the temperature of a battery and/or the temperature of the charger during a charging cycle, a log of information about types of batteries that have been connected to and charged by the charger, a log of information about the length of time to charge and the number of connections as well as connect time to a specific battery, a log of the amount of kilowatt hours consumed during the charging event, and the number of ampere hours returned through the charger to the battery. As may be appreciated, at least some of the types of battery charging information mentioned above may be captured by a battery data recorder while a battery is connected to and being charged by a battery charger.

Battery chargers may have a persistent internal computer readable memory for persistently storing battery charging information or may transmit battery charging information to computer readable memory devices that are external to the battery charger for persistent storage. A battery charger may be connected to or in communication with a battery, and may capture, store and/or transmit battery charging information during the charging of the battery. Battery charging information is preferably received by system 100 via an application programming interface but also may be received via a user interface.

The system 100 also may receive battery environment information and battery application information. Battery environment information may include information about the environment in which the battery is being used, such as, ambient temperature, ambient humidity, atmospheric pressure etc. Battery environment information may be captured, stored and/or transmitted by one or more environmental sensors, which are shown in FIG. 1 as $ES_1$ 130, $ES_2$ 131 to $ES_N$ 132. Environmental sensors are also generally known and commercially available. Examples of such environmental sensors include meteorological devices, such as, thermometers, hygrometers, barometers, hydrogen emission sensors, etc. As may be appreciated, environmental sensors may capture, store and/or transmit information about the environment in which a battery is being used, which may be referred to in this disclosure as battery environment information. Battery environment information also may be received via a user interface to system 100 or via an application programming interface ("API") to an environmental sensor.

Battery application information may include, for example, information about how the battery is being used, such as, information about the type of electric vehicle or device that has been or will be powered by the battery and the amount of time the vehicle or device has been powered by the battery, i.e., runtime or battery draw. Battery application information may further include information about a fleet size, that is, information about the number of battery powered vehicles at one or more locations, fleet composition information, that is, information about each type of battery powered vehicle in a fleet, vehicle use or application information, overall charging profile information, that is, information about whether a battery can and/or should be fast charged, opportunity charged or charged in a battery room, information about operating hours for a battery powered vehicle, ampere hour usage for a battery powered vehicle, battery state-of-charge as read from the truck battery discharge device or meter, vehicle driver, vehicle department of operation and vehicle location information and an operating schedule for a fleet location. Battery application information may also include information about maintenance performed on or repairs to a battery as well as information about a condition or malfunction that necessitated the maintenance and/or repair.

Battery application information may be captured, stored and/or transmitted by one or more vehicle monitoring devices 135, 136, 137. Battery application information also may be received via a user interface to system 100 or via an application programming interface ("API") to a vehicle monitoring device or other device that may capture, store and/or transmit battery application information.

As shown in FIG. 1, system 100 may receive historical battery information, battery charging information, battery environment and/or battery application information from a plurality of battery data recorders, battery chargers, environmental sensors and/or vehicle sensor having application programming interfaces and/or from a user interface. As may be appreciated, different battery data recorders, battery chargers, environmental sensors and/or vehicle sensors all may capture, store and/or transmit information in differing formats. System 100 may include a data transformation processor 140 that may perform an extract-transform-load (ETL) function on information received from the different battery data recorders, battery chargers, environmental sensors and/or vehicle sensors. As is known, the ETL function begins by extracting, i.e., receiving, battery information, such as, for example, historical battery information from selected battery data recorders, battery charging information from selected battery chargers, battery environment information from selected environmental sensors and/or battery application information from selected vehicle sensors. The battery information is then transformed into a common format to allow for further processing. Finally, the battery information that has been transformed into a common format may be loaded into, i.e., stored in, a battery information store 150.

A battery information store 150 may be comprised of a relational database management system and may be used to store historical battery information, battery charging information, battery environment and/or battery application information. However, the data in the battery information store may be stored in other data formats or file structures.

Information about one or more predetermined battery charging profiles, i.e., battery charging curves, also may be stored in battery information store 150. A battery charging profile may be a collection of values for one or more adjustable, that is, configurable, parameters of a battery charger. Adjustable parameters for a battery charger may vary according to charger technology, charger manufacturer or charger specificatons. A battery charging profile for a particular type of battery may comprise information about a varying number and sequence of one or more charging phases. Each charging phase may include information about a current, a voltage and an amount of time a battery should be charged with the current and the voltage. The amount of time of a particular charging phase may be a discrete value or based on an inflection point, at which the voltage and current may be changed or the charging cycle may end. Battery charging profile information also may include information about the upper and lower limits of current and voltage for each charging phase. Parameters of a battery charger may be adjustable or otherwise selectable either via a user interface to a battery charger or via an application programming interface to a battery charger.

For example, a charging profile for a lead acid or gel battery may have a first phase, during which the current output is constant up to a predetermined gasification voltage value. The exemplary charging profile may have a second phase, during which voltage is constant until the current decreases to a predetermined value. During a third phase, this predetermined current value may then be held constant until the end of the charging cycle. As will be discussed in more detail below, a system 100 also may generate a charging profile for a battery responsive to historical battery information, battery charging information and/or environmental and/or application information for the battery.

Still referring to FIG. 1, system 100 also may include a business rules processor 170. As discussed in more detail below in connection with FIG. 4, the business rules processor 170 may be configured to select a predetermined battery charging profile, or generate a battery charging profile, responsive to historical battery information, battery charging information, battery environment information and/or battery application information. As may be appreciated, using an appropriate charging profile, in view of the historical battery information, battery charging information, battery environment information and/or battery application information, will optimize the battery's performance and the life of the battery, which will reduce the cost of ownership of the battery. The business rules processor 170 may be comprised of a commercially available business rules management system, such as, for example, iLog™, which is available from IBM Corporation of Armonk, N.Y.

Continuing with FIG. 1, system 100 also may be comprised of a communications processor 180 for managing the communication of battery profile information, including, for example, information about a battery charging profile selected by the business rules processor for charging a battery. Other information communicated via the communications processor may include information about a maintenance or repair task performed on a battery or a device powered by the battery, or a battery data recorder, battery charger, environmental sensor and/or vehicle sensor. Such information may be communicated via a user interface ("UI") or an application programming interface ("API"). There are many suitable user interfaces for receiving such information, including for example, any computer device with a user interface, including mobile computing devices.

In an embodiment, communications processor 180 may cause the communication of information about a battery charging profile, which was selected or generated by the business rules processor, to a battery charger via an API to the charger. The receipt of the battery charging profile information by the battery charger will cause the battery charger to charge the battery according to the received battery charging profile information. In an alternate embodiment, battery charging profile information may be communicated via a user interface. As may be appreciated, the battery charging profile information displayed via the user interface may be used to adjust a battery charging profile for a charger via a user interface to the battery charger. In another embodiment, information about maintenance and repair tasks to be performed on a battery, battery data recorder, battery charger, environmental sensor and/or vehicle sensor may also be displayed via a user interface.

In another embodiment, the communications processor 180 may be in communication with an enterprise resource planning ("ERP") system 160 to send or receive battery asset information, such as, information about one or more batteries, battery data recorders, battery chargers, environmental sensors and/or vehicle sensors. Battery asset information may include information identifying a particular asset and the technical specifications of such a battery asset, including information about a battery's intended voltage range, intended current output, manufacturer's recommended life cycle, and other performance parameters. ERP systems are known in the art and are used for internal and external management of information across an entire organization, including all major functional areas, such as, financial accounting, human resources, manufacturing and operations, supply chain management, project management, customer relationship management, sales and marketing, and data services. Information exchanged between the ERP system 160 and the battery information store 150 can also be information related to workflow management or product life cycle management and scheduling, which may be used to schedule when a battery should be connected to and/or disconnected from a battery charger 120 to optimize the performance and life of a battery.

In an embodiment, the battery information exchanged between the communications processor and an ERP system may be used, for example, to generate an alert and/or a work order for the performance of maintenance or repair tasks or to adjust a battery, a battery charger, a battery charging profile, an environmental sensor and/or a vehicle sensor. Such information may be communicated using known methods such as a text or SMS message, an application running on a computing device, such as a mobile computing device, instant message, email, computer pop-up, voicemail message, printed work order, or the like.

As also may be seen from FIG. 1, system 100 may also include a management portal 190. The management portal 190 may provide a user interface for inputting information to, and/or receiving information from, system 100 and the various components thereof. Such information, may include, historical battery information, battery charging information, battery environment information, battery application information and/or battery charging profile information. Management portal 190 also may provide a user interface for administering and/or otherwise operating system 100. Management portal 190 also may be used to display battery information to system users.

Figure 2:
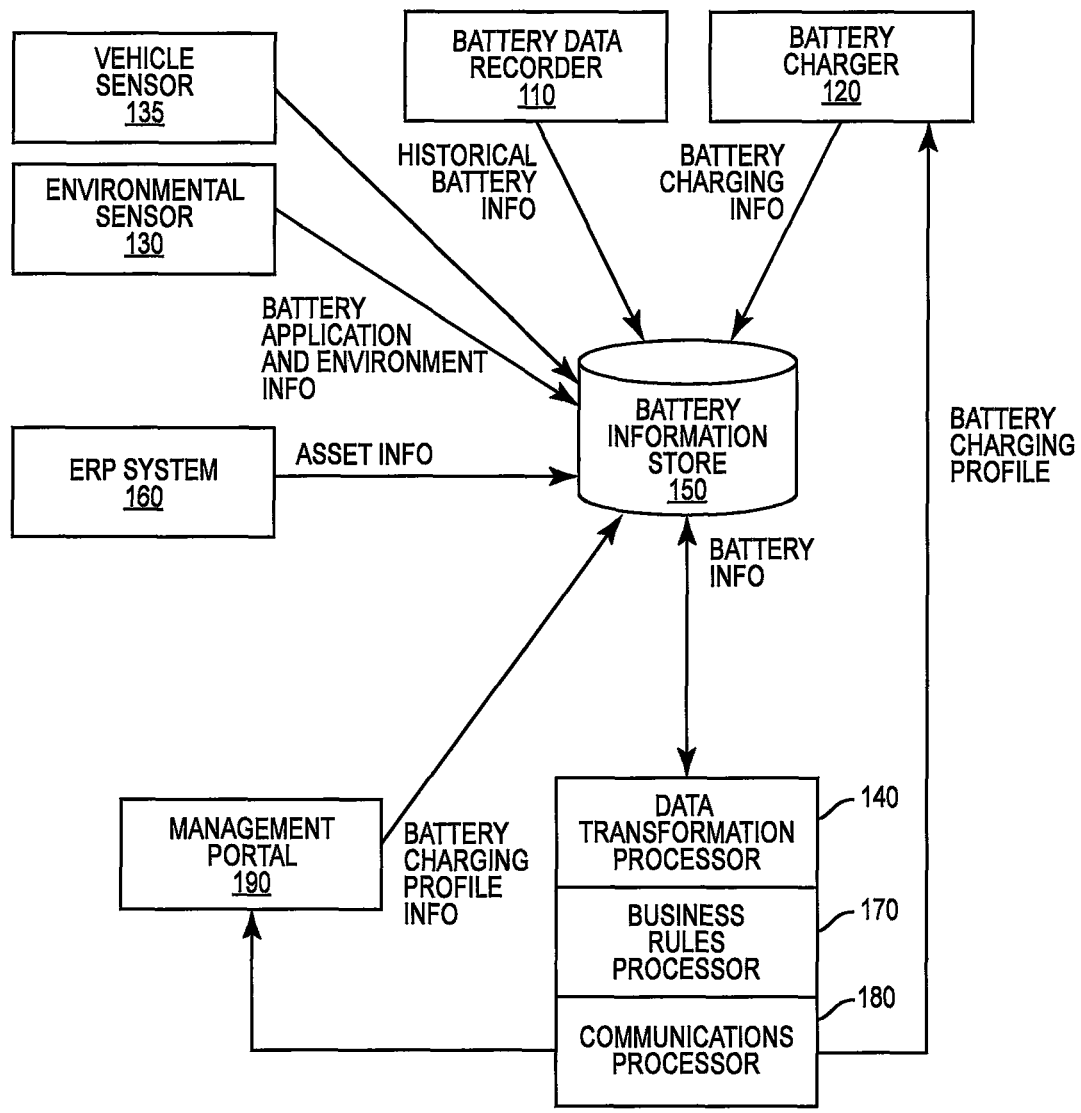
FIG. 2 is a dataflow diagram for a system for using battery information to automatically select and/or create a battery charging profile for a battery, according to some exemplary embodiments.

FIG. 2 is a dataflow diagram for a system for using battery information to automatically select and/or create a battery charging profile for a battery, according to some exemplary embodiments. More specifically, FIG. 2 illustrates the flow of information between the various logical and/or physical components of system 100. For purposes of illustration and clarity of explanation, only a single battery data recorder, battery charger, environmental sensor and vehicle sensor are shown in FIG. 2. However, it may be appreciated that the system, method and computer program product of the present disclosure may be used in connection with a plurality of battery data recorders, battery chargers, environmental sensors and/or vehicle sensors.

As can be seen from FIG. 2, a battery information store 150 receives historical battery information from battery data recorder 110, battery charging information from battery charger 120, battery environment information from environmental sensor 130, battery application information from vehicle sensor 135, as well as battery charging profile information. As discussed above, such information may be received via an application programming interface to such devices. As may be appreciated, such information also may be received by battery information store via management portal 190. As also shown by FIG. 2, battery asset information may be exchanged between battery information store 150 and an ERP system 160.

Continuing with FIG. 2, battery information may be exchanged between battery information store 150 and a data transformation processor 140, a business rules processor 170 and/or a communications processor 180, all of which are described in more detail above. Specifically, battery charging profile information may be transmitted by communications processor 180 to battery charger 120, which includes information about each of the parameters comprising a battery charging profile. Such battery charging profile information may be communicated to a battery charger 120 via an application programming interface to battery charger 120.

Figure 3:
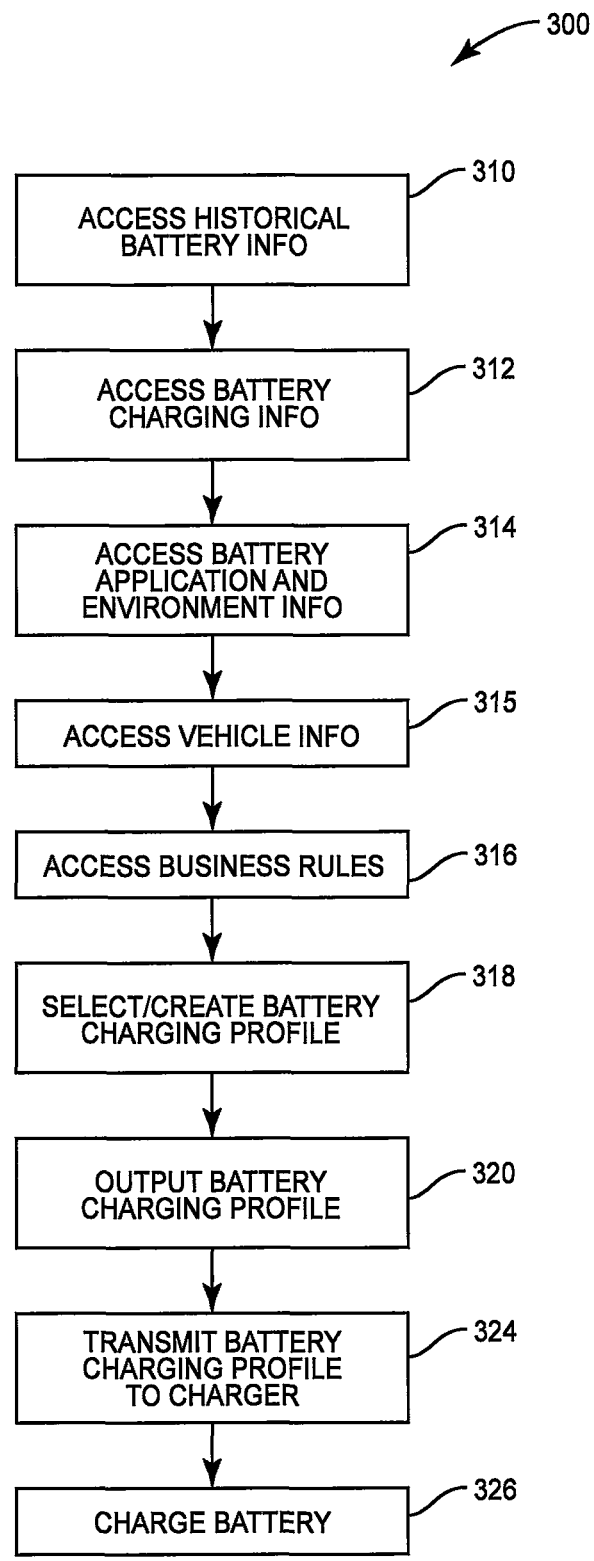
FIG. 3 is a process flow diagram of a method for using battery information to automatically select and/or create a battery charging profile for a battery, according to some exemplary embodiments.

FIG. 3 illustrates a flow diagram for a process 300 for using battery information to automatically select and/or create a battery charging profile for a battery according to some exemplary embodiments. A battery charging profile may be selected or generated by business rules processor 170, which is shown in and described with respect to FIG. 1 and FIG. 2. As has been discussed, a battery charging profile is selected and/or generated in response to receiving battery information to optimize the performance and lifespan of a battery.

As illustrated in FIG. 3, an exemplary computer implemented method begins at block 310 with process 300 accessing historical battery information for a battery to be charged. The historical battery information may be accessed via a battery information store, which is illustrated in and described with respect to FIG. 1 and FIG. 2. As may be appreciated, the battery information store may be comprised of a central database that is remote to a battery data recorder. Alternatively, historical battery information may be accessed directly from a battery data recorder 110 in communication with the battery. Processing control may then be transferred to block 312.

In block 312, process 300 may access battery charging information from a battery charger to be used to charge a battery. Again, the battery charging information may be accessed directly from a battery charger or stored in and accessed via a battery information store. Processing control may then be transferred to block 314.

In block 314, process 300 may access battery application and environment information from an environmental sensor. The battery charging information may be accessed directly from an environmental sensor or stored in and accessed via a battery information store. Processing control may then be transferred to block 315.

In block 315, process 300 may access vehicle information from a vehicle sensor. Vehicle information may be accessed directly from a vehicle sensor or stored in and accessed via a battery information store. Processing control may then be transferred to block 316.

It may be appreciated that the present disclosure is not limited to the order in which the steps illustrated in blocks 310, 312, 314 and 315 are performed. Rather, such steps can be performed in any order or one or more steps may be performed substantially simultaneously. Further, as may be appreciated, it may be advantageous to use as much information as possible in selecting or generating a battery charging profile, a battery charging profile may be selected using less than all of the elements of historical battery information, battery charging information battery application and environment information and/or vehicle information discussed above.

In block 316, process 300 may then access one or more business rules. The business rules may be stored in the battery information store and/or incorporated into the processing logic of a business rules processor. Processing control may then be transferred to block 318.

In block 318, process 300 may select or create a battery charging profile in response to receiving battery information and accessing the business rules. The process of selecting or creating a battery charging profile is illustrated in, and discussed in more detail below in connection with, FIG. 4. Processing control may then be transferred to block 324.

In block 324, process 300 may output information regarding the battery charging profile selected during the process illustrated in block 318. The battery charging profile information may be output via a user interface. In addition to, or instead of, outputting the battery charging profile information, process 300 may cause the battery charging profile information to be transmitted to a battery charger, as illustrated in block 324. As has been discussed, the battery charging profile information may be transmitted to a battery charger via an API to the battery charger. Processing control may then be transferred to block 326.

In block 326, in response to receiving battery charging profile information, a battery may be charged according to the battery charging profile selected or created in the process illustrated in block 318 and transmitted to the battery charger in the process illustrated in step 324.

As may be appreciated, the battery charging profile information selected or created in step 318 may be stored in a computer memory.

Figure 4:
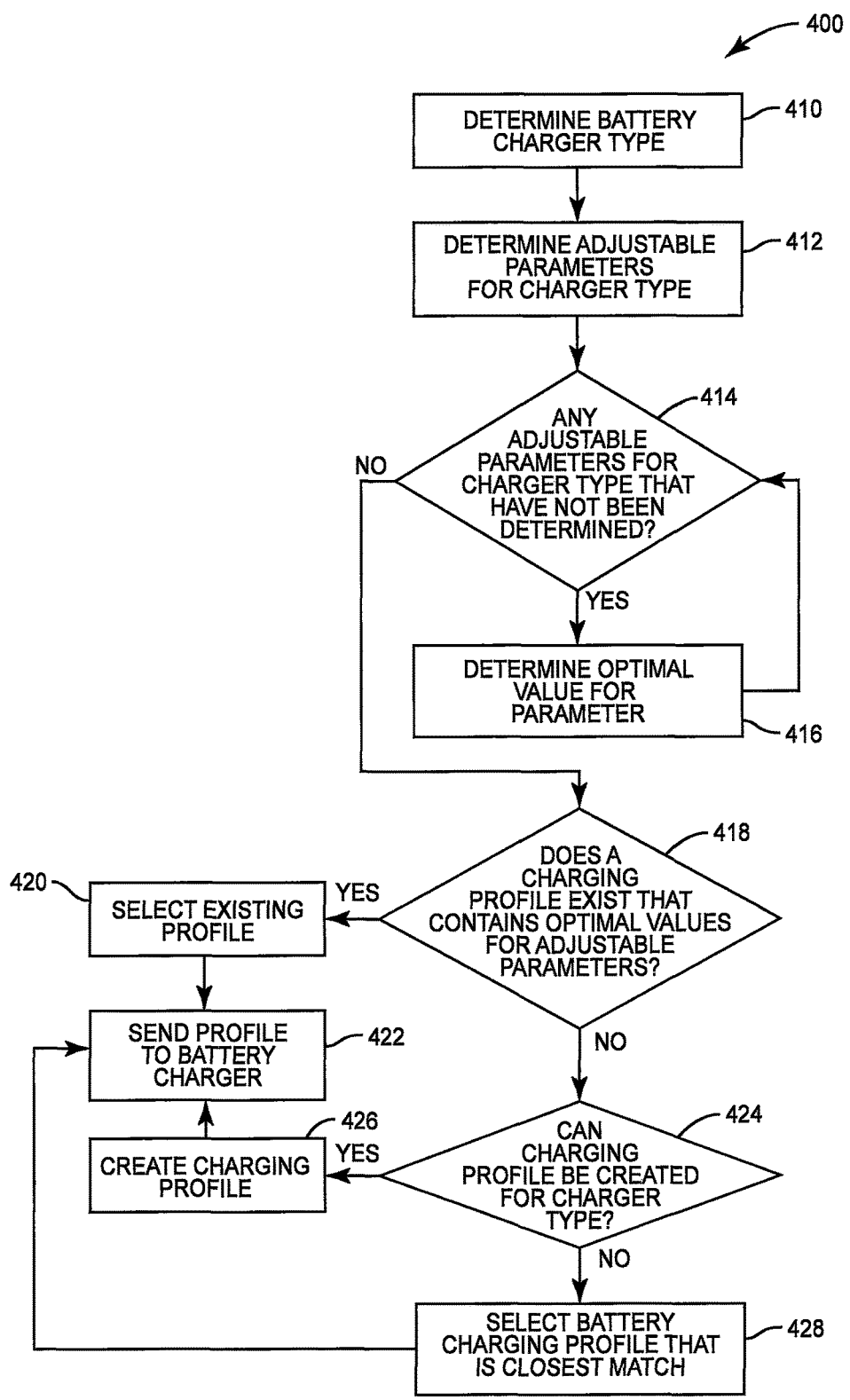
FIG. 4 is a more detailed process flow diagram of a method for using battery information to automatically select and/or create a battery charging profile for a battery, according to some exemplary embodiments.

FIG. 4 is a more detailed flow diagram of a process 400 for using battery information to automatically select or create a battery charging profile for a battery, according to some exemplary embodiments.

As shown in FIG. 4, process 400 may begin at block 410 by determining a battery charger type 410. As may be appreciated, each type of charger may have one or more adjustable parameters that may be unique to a battery type. Processing control may then be transferred to block 412.

In block 412, process 400 determines the adjustable parameters for the battery type identified in the process illustrated in block 410. Some exemplary adjustable parameters for a battery charger are discussed above. Processing control may then be transferred to block 414.

In block 414, process 400 may run a loop to determine the optimal value for each adjustable parameter determined in the process illustrated in block 412 for the battery type determined in the process illustrated in block 410. More specifically, in block 414, process 400 determines whether there are any adjustable parameters for which an optimal value has not been determined. If there are any adjustable parameters for which an optimal value has not been determined, processing control is transferred to block 416.

In block 416, an optimal value is determined for the adjustable parameter identified in block 414. Processing control may then be returned to block 414.

Returning to block 414, if process 400 determines that there are no adjustable parameters for which an optimal value has not been determined, processing control is transferred to block 418.

In block 418, process 400 determines whether a predefined battery charging profile exists that contains the optimal values determined in the process illustrated in block 416 for some or all of the adjustable parameters of a battery charging profile. If process 400 determines that such a battery charging profile exists, processing control may be transferred to block 420.

In block 420, process 400 selects the predetermined or existing battery charging profile that includes the optimal values determined in the process illustrated in block 416. Processing control may then be transferred to block 422.

Returning to block 418, if process 400 determines that a predefined battery charging profile that contains the optimal values determined in the process illustrated in block 416 for some or all of the adjustable parameters of a battery charging profile does not exist, processing control may be transferred to block 424.

In block 424, process 400 may determine whether a new battery charging profile may be created for the type of battery charger identified in the process illustrated in block 410. If process 400 determines that a new battery charging profile may be created for the determined battery charger type, processing control may be transferred to block 426.

In block 426, process 400 creates a new battery charging profile for the identified battery type and the new battery charging profile may be sent to the battery charger, as illustrated in the process illustrated in block 422. Although not shown, process 400 may also include processing logic that may be executed to determine whether the battery charging profile that is created in block 426 is compatible with the battery charger and does not otherwise violate any operating rules set by a battery charger manufacturer to ensure safety and performance of the battery charger.

Returning to block 424, if process 400 determines that a new battery charging profile may not be created for the determined battery charger type, processing control may be transferred to block 428.

In block 428, process 400 selects a battery charging profile that contains the most optimal values for the most adjustable parameters. Processing control may then be transferred to block 422.

In block 422, process 400 sends the battery charging profile that has been selected in the processes illustrated by block 420 or block 428, or the battery charging profile created in the process illustrated by block 426, to the battery charger.

As may be appreciated, the battery charging profile information selected in blocks 420 or 428, or the battery charging profile information created in block 426, may be stored in a computer memory.

Figure 5:
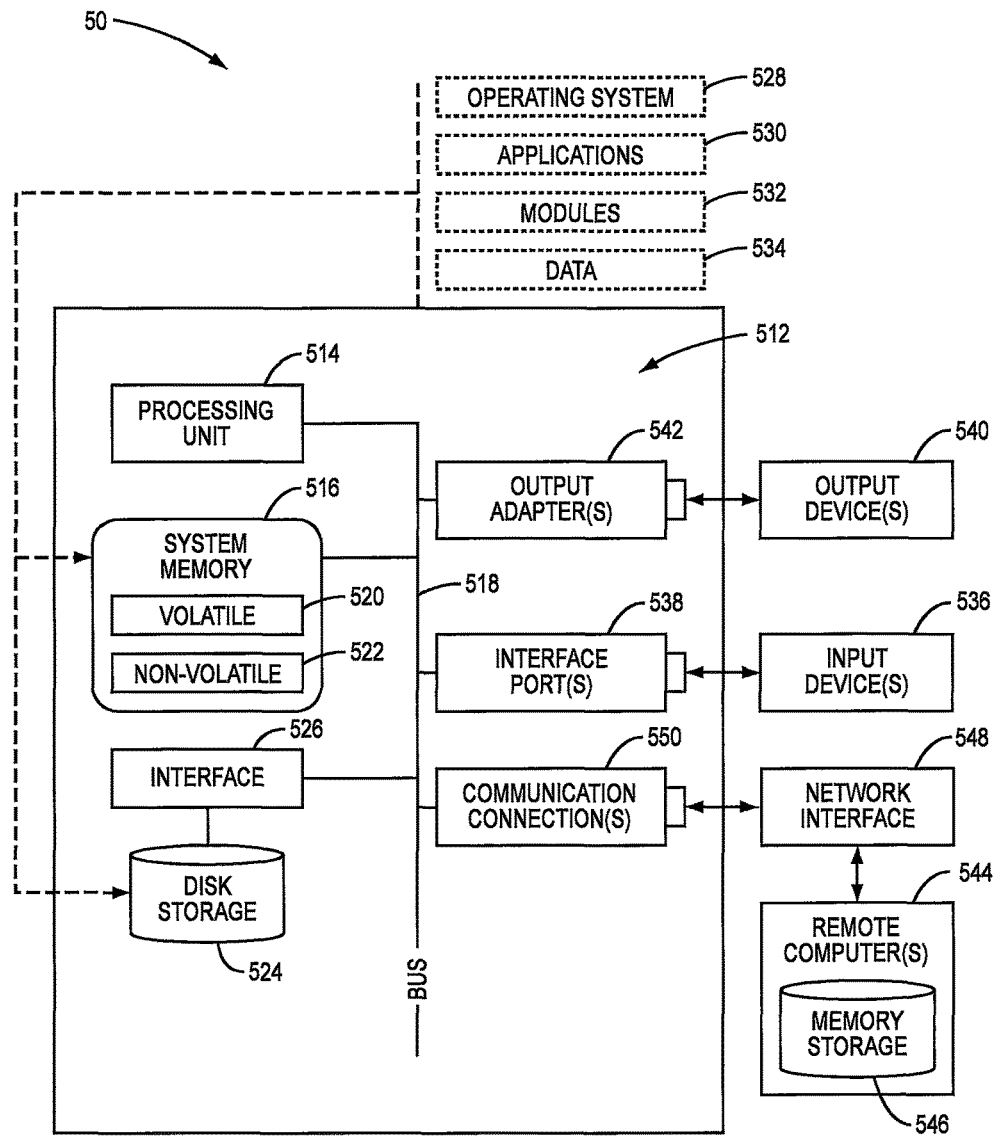
FIG. 5 is a diagram illustrating exemplary hardware and software components that may be used to implement some exemplary embodiments.

FIG. 5 illustrates exemplary hardware and software components that may be used to implement an embodiment of the present invention. While aspects of the invention may be described in the general context of computer-executable instructions, such as program modules, executed by one or more computers or other devices, those skilled in the art will recognize that the invention can also be implemented in combination with other program modules and/or as a combination of hardware and software.

Generally, however, program modules include routines, programs, objects, components, data structures, etc. that can perform particular tasks or implement particular data types. The operating environment 50 is an exemplary suitable operating environment and does not limit the scope of the invention. Other known computer systems, environments, and/or configurations may be suitable for use with the invention.

Referring to FIG. 5, an exemplary environment 50 for implementing various aspects of the invention includes a computer 512, which includes a processing unit 514, a system memory 516, and a system bus 518. The system bus 518 couples the system components including the system memory 516 to the processing unit 514. The processing unit 514 can be any of various processors available. The system bus 518 can be any of the available types of bus structures using any variety of available bus architectures. The system memory 516 includes volatile memory 520 and nonvolatile memory 522.

Computer 512 also may include removable/nonremovable, volatile/nonvolatile computer storage media, for example, a disk storage 524. Disk storage devices 524 may be connected to the system bus 518 via removable or non-removable interface 526.

FIG. 5 also illustrates software that allows interaction between users and computer resources, which may include an operating system 528. System applications 530 are allocated resources by operating system 528 through program modules 532 and program data 534 stored either in system memory 516 or on disk storage 524. Aspects of the present invention may be implemented with various operating systems or combinations of operating systems.

A user enters commands or information into computer 512 through input devices 536, which connect to processing unit 514 through the system bus 518 via interface ports 538. Input devices may include scanners, optical, radio frequency identification, etc., which can be used to identify returned items so that they can be further processed. Output devices 540 use some of the same type of ports as input devices 536. Output adapter 542 may be provided because some output devices 540 like monitors, speakers and printers require special adapters. Other devices and/or systems of devices provide both input and output capabilities such as remote computers 544.

Computer 512 can operate in a networked environment using logical connections to one or more remote computers, such as remote computers 544. The remote computers 544 can be a personal computer, a server, a router, a network PC, a workstation, a microprocessor based appliance, a peer device or other common network node, which may include many or all of the elements of computer 512. While only a single memory storage device 546 is shown, remote computers 544 may be logically connected to computer 512 through a network interface 548 and physically connected via communication connection 550.

The foregoing description includes exemplary embodiments of aspects of the present invention. One of ordinary skill in the art will recognize that many further combinations and permutations of aspects of the present invention are possible. The present invention is intended to include all such alterations, modifications and variations that are within the claims.

What is claimed is:

1. In a system comprising, a battery data recorder, a battery charger and processing circuitry, a computer implemented method for automatically determining a charging profile for a battery, the method comprising:
   accessing, via processing circuitry, historical battery information about a battery from a battery data recorder associated with the battery;
   accessing, via processing circuitry, battery charging information about the battery from a battery charger associated with the battery;
   accessing, via processing circuitry, a plurality of battery charging profiles;
   selecting, via processing circuitry, one of the plurality of battery charging profiles for the battery, wherein the battery charging profile is selected in response to the accessed historical battery information and the battery charging information; and
   outputting information indicating the selected battery charging profile for the battery.

2. The method of claim 1, further comprising:
   transmitting the selected battery charging profile to the battery charger; and
   charging the battery responsive to the transmitted battery charging profile.

3. The method of claim 1, wherein the historical battery information is comprised of information about at least one or more of the following: electrolyte levels, voltage during battery discharging, voltage at a beginning of a charging cycle, voltage during a battery charging cycle, voltage at an end of a charging cycle, battery temperature during battery discharging, battery temperature at a beginning of a charging cycle, battery temperature during a battery charging cycle, battery temperature at an end of a charging cycle, battery discharge time, battery idle time, battery charge time, battery ampere hours consumed, battery ampere hours returned, and frequency and schedule of equalization charges.

4. The method of claim 1, wherein the battery charging information is comprised of information about a battery charger's technical specifications, wherein the information about the battery charger's technical specifications is comprised of information about one ore more adjustable parameters for the battery charger, wherein each of the one or more adjustable parameters is one or more of the following: current, voltage and duration of one or more charging phases, and an upper limit and a lower limit of current and voltage for each charging phase.

5. The method of claim 1, wherein battery charging information is further comprised of information identifying one or more battery charging profiles that can be executed by a battery charger.

6. The method of claim 1, wherein the battery charging information is further comprised of information about one or more of the following: a number of charging cycles performed by the battery charger, information about one or more interruption events, information about a number of complete charging cycles, information about a number of complete charging cycles, information about a temperature of a battery during a charging cycle, information about a temperature of a battery charger during a charging cycle, information about each type of battery that has been connected to and charged by the battery charger, information about length of time to charge a battery, information about a number of connections to a battery, information about an amount of time a battery charger is connected to a battery, information about an amount of kilowatt hours consumed during a battery charging event, and information about a number of ampere hours returned by a battery charger to a battery.

7. The method of claim 1, further comprising:
   accessing, via processing circuitry, battery application information; and
   selecting, via processing circuitry, one of the plurality of battery charging profiles for the battery, wherein the battery charging profile is selected in response to the accessed battery application information.

8. The method of claim 7, wherein the battery application information is comprised of information about at least one of the following: information about a type of electric vehicle powered by the battery, an amount of time a vehicle has been powered by the battery, fleet size information, wherein the fleet size information is information about a number of battery powered vehicles at one or more locations, fleet composition information, wherein fleet composition information is information about each type of battery powered vehicle in a fleet, vehicle use or application information, overall charging profile information, wherein overall charging profile information is information about whether a battery may be fast charged, opportunity charged or charged in a battery room, information about operating hours for a battery powered vehicle, information about ampere hour usage for a battery powered vehicle, information about a battery's state-of-charge as recorded by a battery power vehicle's battery discharge device or meter, information identifying an operator of a battery powered vehicle, information about a department of operation associated with a battery powered vehicle, information about a location of a battery powered vehicle and information about an operating schedule for a fleet of battery powered vehicles.

9. The method of claim 7, wherein the battery application information is comprised of information about at least one of the following: maintenance performed on a battery, a repair to a battery, a battery condition and a battery malfunction.

10. The method of claim 7, wherein the battery application information is received from one or more vehicle sensors.

11. The method of claim 1, further comprising:
accessing, via processing circuitry, battery environment information; and
selecting, via processing circuitry, one of the plurality of battery charging profiles for the battery, wherein the battery charging profile is selected in response to the accessed battery environment information.

12. The method of claim 11, wherein the battery environment information is comprised of information about at least one of the following: ambient temperature, ambient humidity and hydrogen emissions.

13. The method of claim 11, wherein the battery environment information is received from one or more environmental sensors.

14. The method of claim 1, wherein each of the plurality of battery charging profiles is comprised of information about at least one of the following battery charger parameters: charge time, voltage and current.

15. The method of claim 1, wherein each of the plurality of battery charging profiles is comprised of information about one or more charging phases, and information about each of the one or more charging phases may include information about a phase current, a phase voltage and an amount of time a battery should be charged with the phase current and the phase voltage.

16. The method of claim 1, wherein the step of sending the battery charging profile to the battery charger is comprised of sending the battery charging profile via an interface to the battery charger.

17. The method of claim 16, wherein the interface to the battery charger is an application programming interface.

18. The method of claim 1, further comprising:
creating a battery charging profile for the battery, wherein the battery charging profile is created responsive to the historical battery information and the battery charging information.

19. The method of claim 18, wherein the battery charging profile is created responsive to the battery application information.

20. The method of claim 18, wherein the battery charging profile is created responsive to the battery environment information.

21. A computer implemented system for automatically determining a charging profile for a battery, the system comprising:
a computer memory, wherein the computer memory stores historical battery information about a battery from a battery data recorder associated with the battery, battery charging information about the battery from a battery charger associated with the battery and a plurality of battery charging profiles;
a computer processor, wherein the computer processor is configured to
select one of the plurality of battery charging profiles for the battery, wherein the battery charging profile is selected in response to historical battery information and the battery charging information; and
output information indicating the selected battery charging profile for the battery.

22. The system of claim 21, wherein the computer processor is further configured to:
transmit the selected battery charging profile to the battery charger; and
charge the battery responsive to the transmitted battery charging profile.

23. The system of claim 21, wherein the historical battery information is comprised of information about at least one or more of the following: electrolyte levels, voltage during battery discharging, voltage at a beginning of a charging cycle, voltage during a battery charging cycle, voltage at an end of a charging cycle, battery temperature during battery discharging, battery temperature at a beginning of a charging cycle, battery temperature during a battery charging cycle, battery temperature at an end of a charging cycle, battery discharge time, battery idle time, battery charge time, battery ampere hours consumed, battery ampere hours returned, and frequency and schedule of equalization charges.

24. The system of claim 21, wherein the battery charging information is comprised of information about a battery charger's technical specifications, wherein the information about the battery charger's technical specifications is comprised of information about one ore more adjustable parameters for the battery charger, wherein each of the one or more adjustable parameters is one or more of the following: current, voltage and duration of one or more charging phases, and an upper limit and a lower limit of current and voltage for each charging phase.

25. The system of claim 21, wherein battery charging information is further comprised of information identifying one or more battery charging profiles that can be executed by a battery charger.

26. The system of claim 1, wherein the battery charging information is further comprised of information about one or more of the following: a number of charging cycles performed by the battery charger, information about one or more interruption events, information about a number of complete charging cycles, information about a number of complete charging cycles, information about a temperature of a battery during a charging cycle, information about a temperature of a battery charger during a charging cycle, information about each type of battery that has been connected to and charged by the battery charger, information about length of time to charge a battery, information about a number of connections to a battery, information about an amount of time a battery charger is connected to a battery, information about an amount of kilowatt hours consumed during a battery charging event, and information about a number of ampere hours returned by a battery charger to a battery.

27. The system of claim 21, wherein:
the computer memory stores battery application information; and
the computer processor is further configured to select one of the plurality of battery charging profiles for the battery, wherein the battery charging profile is selected in response to the battery application information.

28. The system of claim 27, wherein the battery application information is comprised of information about at least one of the following: information about a type of electric vehicle powered by the battery, an amount of time a vehicle has been powered by the battery, fleet size information, wherein the fleet size information is information about a number of battery powered vehicles at one or more locations, fleet composition information, wherein fleet composition information is information about each type of battery powered vehicle in a fleet, vehicle use or application information, overall charging profile information, wherein overall charging profile information is information about whether a battery may be fast charged, opportunity charged or charged in a battery room, information about operating hours for a battery powered vehicle, information about ampere hour usage for a battery powered vehicle, information about a battery's state-of-charge as recorded by a battery power vehicle's battery discharge device or meter, information identifying an operator of a battery powered vehicle, information about a department of operation associated with a battery powered vehicle, information about a location of a battery powered vehicle and information about an operating schedule for a fleet of battery powered vehicles.

29. The system of claim 27, wherein the battery application information is comprised of information about at least one of the following: maintenance performed on a battery, a repair to a battery, a battery condition and a battery malfunction.

30. The system of claim 27, wherein the battery application information is received from one or more vehicle sensors.

31. The system of claim 21, wherein:
the computer memory for stores battery environment information; and
the computer processor is further configured to select one of the plurality of battery charging profiles for the battery, wherein the battery charging profile is selected in response to the battery environment information.

32. The system of claim 31, wherein the battery environment information is comprised of information about at least one of the following: ambient temperature, ambient humidity and hydrogen emissions.

33. The system of claim 31, wherein the battery environment information is received from one or more environmental sensors.

34. The system of claim 31, wherein each of the plurality of battery charging profiles is comprised of information about at least one of the following battery charger parameters: charge time, voltage and current.

35. The system of claim 31, wherein each of the plurality of battery charging profiles is comprised of information about one or more charging phases, and information about each of the one or more charging phases may include information about a phase current, a phase voltage and an amount of time a battery should be charged with the phase current and the phase voltage.

36. The system of claim 31, wherein the computer processor is further configured to send the selected battery charging profile via an interface to the battery charger.

37. The system of claim 36, wherein the interface to the battery charger is an application programming interface.

38. The system of claim 31, wherein:
the computer processor is further configure to create a battery charging profile for the battery, wherein the battery charging profile is created responsive to the historical battery information and the battery charging information.

39. The system of claim 38, wherein the battery charging profile is created responsive to the battery application information.

40. The system of claim 38, wherein the battery charging profile is created responsive to the battery environment information.

41. A non-transitory computer readable medium having stored thereon instructions for automatically determining a charging profile for a battery, which when executed by a processor, cause the processor to:
access historical battery information about a battery from a battery data recorder associated with the battery;
access battery charging information about the battery from a battery charger associated with the battery;
access a plurality of battery charging profiles;
select one of the plurality of battery charging profiles for the battery, wherein the battery charging profile is selected in response to the accessed historical battery information and the battery charging information; and
output information indicating the selected battery charging profile for the battery.

42. The computer readable medium of claim 41, further comprising instructions, which when executed by a processor, cause the processor to:
transmit the selected battery charging profile to the battery charger; and
charge the battery responsive to the transmitted battery charging profile.

43. The computer readable medium of claim 41, wherein the historical battery information is comprised of information about at least one or more of the following: electrolyte levels, voltage during battery discharging, voltage at a beginning of a charging cycle, voltage during a battery charging cycle, voltage at an end of a charging cycle, battery temperature during battery discharging, battery temperature at a beginning of a charging cycle, battery temperature during a battery charging cycle, battery temperature at an end of a charging cycle, battery discharge time, battery idle time, battery charge time, battery ampere hours consumed, battery ampere hours returned, and frequency and schedule of equalization charges.

44. The computer readable medium of claim 41, wherein the battery charging information is comprised of information about a battery charger's technical specifications, wherein the information about the battery charger's technical specifications is comprised of information about one ore more adjustable parameters for the battery charger, wherein each of the one or more adjustable parameters is one or more of the following: current, voltage and duration of one or more charging phases, and an upper limit and a lower limit of current and voltage for each charging phase.

45. The computer readable medium of claim 41, wherein battery charging information is further comprised of information identifying one or more battery charging profiles that can be executed by a battery charger.

46. The computer readable medium of claim 41, wherein the battery charging information is further comprised of information about one or more of the following: a number of charging cycles performed by the battery charger, information about one or more interruption events, information about a number of complete charging cycles, information about a number of complete charging cycles, information about a temperature of a battery during a charging cycle, information about a temperature of a battery charger during a charging cycle, information about each type of battery that has been connected to and charged by the battery charger, information about length of time to charge a battery, information about a number of connections to a battery, information about an amount of time a battery charger is connected to a battery, information about an amount of kilowatt hours consumed during a battery charging event, and information about a number of ampere hours returned by a battery charger to a battery.

47. The computer readable medium of claim 41, further comprising instructions, which when executed by a processor, cause the processor to:
access battery application information; and
select one of the plurality of battery charging profiles for the battery, wherein the battery charging profile is selected in response to the accessed battery application information.

48. The computer readable medium of claim 47, wherein the battery application information is comprised of information about at least one of the following: information about a type of electric vehicle powered by the battery, an amount of time a vehicle has been powered by the battery, fleet size information, wherein the fleet size information is information about a number of battery powered vehicles at one or more locations, fleet composition information, wherein fleet composition information is information about each type of battery powered vehicle in a fleet, vehicle use or application information, overall charging profile information, wherein overall charging profile information is information about whether a battery may be fast charged, opportunity charged or charged in a battery room, information about operating hours for a battery powered vehicle, information about ampere hour usage for a battery powered vehicle, information about a battery's state-of-charge as recorded by a battery power vehicle's battery discharge device or meter, information identifying an operator of a battery powered vehicle, information about a department of operation associated with a battery powered vehicle, information about a location of a battery powered vehicle and information about an operating schedule for a fleet of battery powered vehicles.

49. The computer readable medium of claim 47, wherein the battery application information is comprised of information about at least one of the following: maintenance performed on a battery, a repair to a battery, a battery condition and a battery malfunction.

50. The computer readable medium of claim 47, wherein the battery application information is received from one or more vehicle sensors.

51. The computer readable medium of claim 41, further comprising instructions, which when executed by a processor, cause the processor to:
 access battery environment information; and
 select one of the plurality of battery charging profiles for the battery, wherein the battery charging profile is selected in response to the accessed battery environment information.

52. The computer readable medium of claim 51, wherein the battery environment information is comprised of information about at least one of the following: ambient temperature, ambient humidity and hydrogen emissions.

53. The computer readable medium of claim 51, wherein the battery environment information is received from one or more environmental sensors.

54. The computer readable medium of claim 41, wherein each of the plurality of battery charging profiles is comprised of information about at least one of the following battery charger parameters: charge time, voltage and current.

55. The computer readable medium of claim 41, wherein each of the plurality of battery charging profiles is comprised of information about one or more charging phases, and information about each of the one or more charging phases may include information about a phase current, a phase voltage and an amount of time a battery should be charged with the phase current and the phase voltage.

56. The computer readable medium of claim 41, wherein the step of sending the battery charging profile to the battery charger is comprised of sending the battery charging profile via an interface to the battery charger.

57. The computer readable medium of claim 56, wherein the interface to the battery charger is an application programming interface.

58. The computer readable medium of claim 41, further comprising instructions, which when executed by a processor, cause the processor to:
 create a battery charging profile for the battery, wherein the battery charging profile is created responsive to the historical battery information and the battery charging information.

59. The computer readable medium of claim 58, wherein the battery charging profile is created responsive to the battery application information.

60. The computer readable medium of claim 58, wherein the battery charging profile is created responsive to the battery environment information.

\* \* \* \* \*